(12) United States Patent
Rossi et al.

(10) Patent No.: US 8,542,056 B2
(45) Date of Patent: Sep. 24, 2013

(54) HIGH VOLTAGE TRANSMISSION SWITCH, NAMELY FOR ULTRASOUND APPLICATIONS

(75) Inventors: Sandro Rossi, Pavia (IT); Giulio Ricotti, Broni (IT)

(73) Assignee: STMicroelectronics S.rl., Agrate Brianza (IT)

( * ) Notice: Subject to any disclaimer, the term of this patent is extended or adjusted under 35 U.S.C. 154(b) by 305 days.

(21) Appl. No.: 12/979,149

(22) Filed: Dec. 27, 2010

(65) Prior Publication Data

US 2012/0161819 A1 Jun. 28, 2012

(51) Int. Cl.
*H03K 17/687* (2006.01)

(52) U.S. Cl.
USPC .......................... 327/427; 327/108

(58) Field of Classification Search
USPC ................ 327/365, 376, 377, 427, 538, 540, 327/541, 108, 109
See application file for complete search history.

(56) References Cited

U.S. PATENT DOCUMENTS

| 7,750,689 B1 * | 7/2010 | Rana et al. | 327/108 |
| 7,782,116 B2 * | 8/2010 | Jasa et al. | 327/389 |
| 8,242,830 B2 * | 8/2012 | Soma et al. | 327/427 |

* cited by examiner

*Primary Examiner* — Hai L Nguyen
(74) *Attorney, Agent, or Firm* — Seed IP Law Group PLLC

(57) ABSTRACT

A high voltage transmission switch comprises a switching block coupled between a connection terminal to a load and a low voltage output terminal and comprising at least a first switching transistor and a second switching transistor coupled between the connection terminal and the low voltage output terminal and interconnected at a first circuit node; and a driving circuit coupled between a positive low voltage supply reference and a negative high voltage supply reference and having an output terminal connected to the switching block. The driving circuit including at least a first driving transistor coupled between the positive low voltage supply reference and the output terminal and a second driving transistor coupled between the output terminal and the negative high voltage supply reference.

30 Claims, 5 Drawing Sheets

HIGH VOLTAGE TRANSMISSION SWITCH, NAMELY FOR ULTRASOUND APPLICATIONS

BACKGROUND

1. Technical Field

The present disclosure relates to a high voltage transmission switch.

The disclosure particularly, but not exclusively, relates to a high voltage switch for a transmission channel for ultrasound applications and the following description is made with reference to this field of application for convenience of explanation only.

2. Description of the Related Art

As is well known, sonography or ultrasonography is a system of medical diagnostic testing that uses ultrasonic waves or ultrasounds and is based on the principle of the transmission of ultrasounds and of the emission of echo and is widely used in the internal, surgical and radiological fields.

The normally used ultrasounds are comprised between 2 and 20 MHz. The frequency is chosen by taking into consideration that higher frequencies have a greater image resolving power, but penetrate less in depth in the subject under examination.

These ultrasounds are normally generated by a piezoceramic crystal inserted in a probe maintained in direct contact with the skin of the subject with the interposition of a suitable gel (being used to eliminate the air between probe and subject's skin, allowing the ultrasounds to penetrate in the anatomic segment under examination). The same probe is able to collect a return signal or echo, which is processed by a computer and displayed on a monitor.

In particular, the ultrasounds that reach a variation point of the acoustic impedance, and thus for example an internal organ, are partially reflected, the reflected percentage conveying information about the impedance difference between the crossed tissues. It is to be noted that, the big impedance difference between a bone and a tissue being considered, with the sonography it is not possible to see behind a bone, which causes a total reflection of the ultrasounds, while air or gas zones give "shade", causing a partial reflection of the ultrasounds.

The time employed by an ultrasonic wave for carrying out the path of going, reflection and return is provided to the computer, which calculates the depth wherefrom the echo has come, thus identifying the division surface between the crossed tissues (corresponding to the variation point of the acoustic impedance and thus to the depth wherefrom the echo comes).

Substantially, an ultrasonographer, in particular a diagnostic apparatus based on the ultrasound sonography, typically comprises three parts:

- a probe comprising at least one transducer, in particular of the ultrasonic type, which transmits and receives an ultrasound signal;
- an electronic system that drives the transducer for the generation of the ultrasound signal or pulse to be transmitted and receives an echo signal of return of this pulse at the probe, processing in consequence the received echo signal; and
- a displaying system of a corresponding sonographic image being processed starting from the echo signal as received by the probe.

The word "transducer" generally indicates an electric or electronic device that converts a type of energy relative to mechanical and physical magnitudes into electric signals. In a broad sense, a transducer is sometimes defined as any device that converts energy from a form to another, so that this latter can be re-processed either by men or by other machines. Many transducers are both sensors and actuators. An ultrasonic transducer usually comprises a piezoelectric crystal that is suitably biased for causing its deformation and the generation of the ultrasound signal or pulse.

Ultrasonic transducers for sonography images are usually driven by high voltage driving circuits or drivers able to generate a sinusoidal signal of variable width comprised between 3 and 200 Vpp (200 Vpp being the power supply voltage value) and frequencies in the range 1 MHz to 20 MHz, this sinusoidal signal being a control signal for corresponding generators of the ultrasound pulse to be transmitted, in particular piezoelectric crystals.

The driving of transducers for ultrasonic applications typically involves in particular the application of high voltage signals (+/−100V) with frequencies in the range of 1 to 6 MHz.

The corresponding driving circuits are thus made of components that can sustain these high voltages and that, given the frequencies at stake, can supply currents high enough to a load applied at the output, in particular an ultrasonic transducer.

This to use components with rather big sizes. These components however add high parasitic capacitances in parallel to the transducer.

Moreover, the transducer itself is also used for the receiving in a transmission channel for these ultrasound applications. Typically, an ultrasonic transducer transmits a high voltage pulse of the duration of a few μs, and receives the echo of this pulse, generated by the reflection on the organs of a subject under examination, for the duration of about 250 μs, for going back to the transmission of a new high voltage pulse. For example, a first pulse IM1 and a second pulse IM2 are transmitted with a peak to peak excursion equal, in the example shown, to 190 Vpp with reception by the transducer of corresponding echo indicated with E1 and E2, as schematically shown in FIG. 1.

The echo signal or return acoustic wave is converted into an electric wave that turns out to be a signal of some millivolts of width, signal that is then amplified by low noise amplifier circuits, connected to the transducer itself, in turn disturbed by the parasite capacity due to the high voltage components of the driving circuit of the transducer. This reduces the quality of the echo signal.

FIG. 2 schematically shows a transmission channel of an impulsive signal for an ultrasound transducer, in particular an ultrasound transducer UST, realized according to the prior art. The transmission channel is globally indicated by 20.

By way of illustration, only an output section of the transmission channel 20 has been actually shown being connected to the ultrasound transducer UST and supplying it with an impulsive signal IM generated by suitable circuitry (not shown) and already on an input terminal IN of the transmission channel 20.

Actually, the front-end portion of the driving channels of ultrasound transducers for ultrasound applications, comprises a transmission circuit able to apply a high voltage electric signal (ranging from 3 to 200 Vpp) to the piezoelectric transducer UST and an high voltage transmission switch (usually also indicated as T/R Switch) having the function of always connecting the ultrasound transducer UST with the input terminal of a receiver.

Moreover, the ultrasound transducer UST can be a piezoelectric transducer or a CMUT (Capacitive Mems Ultrasound Transducer). In any case, it works as a transmitter of acoustic waves and also as a receiver (like a microphone) by converting an acoustic signal into an electric signal.

In particular, making reference to the scheme of FIG. 2, the transmission channel 20 comprises transmission circuitry 21 being inserted between the input terminal IN and a first high voltage output terminal HVout, whereto the input impulsive signal IM is transmitted.

The transmission circuitry 21 may be, as indicated in FIG. 2, a matrix of high voltage switches (MATRIXsw) or an impulser, being able to directly generate a high voltage signal.

Furthermore, the transmission channel 20 comprises a second low voltage output terminal LVout connected to a Low Noise Amplifier 23 (LNA), for instance a transconductance cell, and a connection terminal Xdcr to the ultrasound transducer UST. Finally, the transmission channel 20 comprises at least one high voltage transmission switch 22 (TRsw) connected between the first high voltage output terminal HVout and the second low voltage output terminal LVout.

This high voltage transmission switch 22 is able to transmit an output signal to the second low voltage output terminal LVout during the receiving step of the transmission channel 20.

In particular, it is to be noted that the transmission switch 22 is a high voltage one since, during the transmission step of the transmission channel 20, a signal being on the connection terminal Xdcr, always indicated with Xdcr, is a high voltage signal even if the switch 22 is off. When this switch 22 is instead on, i.e. during the reception step of the transmission channel 20, the signal Xdcr is generally at a voltage value next to zero since the piezoelectric transducer being connected to the transmission channel 20 is detecting small return echoes of ultrasound pulse signals.

Typically, in fact, an ultrasonic transducer transmits a high voltage pulse of the duration of a few μs, and receives the echo of this pulse, generated by the reflection on the organs of a subject under examination, for the duration of about 250 μs, for going back to the transmission of a new high voltage pulse.

A high voltage transmission switch of the known type is shown for instance in FIG. 3, globally indicated by 32.

The high voltage transmission switch 32 is a passive diode-switch being inserted between the connection terminal Xdcr to the ultrasound transducer UST and the low voltage output terminal LVout and comprising at least a diode bridge 31 in turn including a first diode HVD1 and a second diode HVD2 being inserted, in series to each other, between a first or positive low voltage terminal LVP and a second or negative low voltage terminal LVN, as well as a third diode HVD3 and a fourth diode HVD4 being inserted, in series to each other, between the positive and negative low voltage terminals, LVP and LVN.

Moreover, the positive low voltage terminal LVP is connected to a positive voltage supply reference +Vpp by means of a first or positive current generator GP of a first or positive current IP and the negative low voltage terminal LVP is connected to a negative voltage supply reference −Vpp by means of a second or negative current generator GN of a second or negative current IP.

More particularly, the first and second diodes, HVD1 and HVD2, are connected to each other at a first internal circuit node XD1, in turn connected to the connection terminal Xdcr by means of a first resistor R1. In FIG. 3, a noisy impulsive signal INOISE has been indicated in order to model the transducer element. Moreover, the third and fourth diodes, HVD3 and HVD4, are connected to each other at a second internal circuit node XD2, in turn connected to the low voltage output terminal LVout. The low voltage output terminal LVout is also connected to ground GND by means of a second resistor R2 in order to model the connection to a Low Noise Amplifier (not shown). Namely, the first diode HVD1 has an anode connected to the positive low voltage terminal LVP and a cathode connected to the first internal circuit node XD1, the second diode HVD2 has an anode connected to the first internal circuit node XD1 and a cathode connected to the negative low voltage terminal LVN, the third diode HVD3 has an anode connected to the positive low voltage terminal LVP and a cathode connected to the second internal circuit node XD2 and the fourth diode HVD2 has an anode connected to the second internal circuit node XD2 and a cathode connected to the negative low voltage terminal LVN.

Usually, the first and second resistors, R1 and R2, are of a same value, for instance 100Ω. Moreover, the positive and negative current generators, GP and GN, issues corresponding currents (IP=IN) being chosen between 2 mA, 4 mA and 8 mA.

This kind of high voltage transmission switch 32 is well known in the art and is largely used in the diagnostic apparatuses based on the ultrasound sonography actually on the market. Such known apparatuses usually comprise only a limited number of channels and thus have a low resolution. Moreover, the known type of high voltage transmission switches usually comprise discrete components being directly integrated on the PC boards inside the console of the diagnostic apparatus.

The main drawback of the known solutions is tied to its high power consumption needed to bring the high voltage transmission switch on (and thus its diodes directly biased). In fact, the resistance in series being introduced by the high voltage transmission switch only depends on the biasing current.

It is thus known to raise the current flowing through the diodes in order to have a low resistance and thus a low noise level. In particular, the resistance and the biasing current of the diodes are linked by the following formula:

$$Rd = \frac{KT}{q} \cdot \frac{1}{Ibias}$$

being:
Rd the value of the resistance of a diode;
Ibias its biasing current;
K the Boltzmann constant;
T the absolute temperature; and
q the electron charge.

It should be also remarked that the high voltage transmission switch is usually connected to a terminal (Xdcr) receiving a high voltage value during a transmission phase and to a terminal (LVout) always connected to a low voltage value, being in turn connected to the input of the Low Noise Amplifier (LNA) and thus biased with a voltage between 0V and 2-3V.

Another feature of the high voltage transmission switch is that, when in its closed state, the switch should not transmit any current.

BRIEF SUMMARY

An embodiment of this disclosure is directed to a high voltage transmission switch for a diagnostic apparatus based on the ultrasound sonography comprising active components, and namely MOS transistors, for which the resistance in series or Ron resistance only depends on the geometric parameters of the switch, in particular the sizes of the MOS transistors and no more on the biasing current. In this way, no biasing current is needed to bring the high voltage transmission switch on, thus overcoming the limits which still affect the devices realized according to the prior art.

The high voltage transmission switch according to an aspect of the disclosure comprises:

a switching block being coupled between a connection terminal to a load and a low voltage output terminal and comprising at least a first switching transistor and a second switching transistor being coupled between the connection terminal and the low voltage output terminal and interconnected at a first circuit node; and a driving circuit being coupled between a positive low voltage supply reference and a negative high voltage supply reference and having an output terminal connected to the switching block, the driving circuit in turn comprising at least a first driving transistor being coupled between the positive low voltage supply reference and the output terminal and a second driving transistor being coupled between the output terminal and the negative high voltage supply reference.

More in particular, the disclosure comprises the following supplemental and optional features, taken alone or in combination when needed.

According to an aspect of the disclosure, the first and second switching transistors may have a common source terminal and respective control terminals coupled to a second circuit node, in turn coupled to the output terminal of the driving circuit and to the first circuit node by means of a Zener diode as a protection element.

According to another aspect of the disclosure, the first and second switching transistors may be High Voltage MOS transistors of the N type.

Moreover, according to an aspect of the disclosure, the positive low voltage reference may have a value compatible with the CMOS technology.

According to a further aspect of the disclosure, the first driving transistor may have a control terminal directly connected to an input terminal of the driving circuit wherein a logic control signal is provided, the logic control signal being a CMOS control signal ranging between a ground value and the positive low voltage supply value; and the second driving transistor may have a control terminal connected the input terminal by means of a level shifter, which transforms the logic control signal into a control signal ranging between the positive low voltage supply value and the negative high voltage supply value.

Furthermore, according to another aspect of the disclosure, the high voltage transmission switch may further comprise an output buffer being coupled between the positive low voltage supply reference and a negative low voltage supply reference and connected to the low voltage output terminal as an ESD protection element, the positive and negative low voltage supply references having values being compatible with the CMOS technology.

According to this aspect of the disclosure, the output buffer may comprise a series of a first diode and a second diode inserted between the positive and negative low voltage supply references and interconnected at the low voltage output terminal.

Another embodiment of this disclosure is directed to a high voltage transmission switch comprising:

a switching block being coupled between a connection terminal to a load and a low voltage output terminal and comprising at least a first switching transistor and a second switching transistor being coupled between the connection terminal and the low voltage output terminal and interconnected at a first circuit node; and a driving circuit being coupled between a positive low voltage supply reference and a negative low voltage supply reference and having a first and a second output terminals connected to the switching block, the driving circuit in turn comprising at least the series of a first driving transistor and a driving diode being coupled between the positive low voltage supply reference and the first output terminal and a second driving transistor being coupled between the first output terminal and the negative low voltage supply reference.

According to an aspect of the disclosure, the first switching transistor may have a control terminal coupled to a second circuit node, in turn coupled to the first output terminal of the driving circuit and to the first circuit node by means of a Zener diode as a protection element and the second switching transistor may have a control terminal coupled to a third circuit node, in turn coupled to the second output terminal of the driving circuit.

According to another aspect of the disclosure, the first switching transistor may be a High Voltage MOS transistor of the P type and the second switching transistor may be a High Voltage MOS transistor of the N type, the first switching transistor having a source terminal connected to a drain terminal of the second switching transistor.

Moreover, according to an aspect of the disclosure, the positive and negative low voltage references may have values compatible with the CMOS technology.

According to another aspect of the disclosure, the first driving transistor may have a control terminal directly connected to an input terminal of the driving circuit wherein a logic control signal is provided, the logic control signal being a CMOS control signal ranging between a ground value and the positive low voltage supply value; and the second driving transistor may have a control terminal connected the input terminal of the driving circuit by means of a level shifter, which transforms the logic control signal into a control signal ranging between the negative low voltage supply value and the ground value.

According to yet another aspect of the disclosure, the driving circuit may further comprise an inverter coupled between its input terminal and its second output terminal.

Furthermore, according to an aspect of the disclosure, the high voltage transmission switch may further comprise an output buffer being coupled between the positive low voltage supply reference and a negative low voltage supply reference and connected to the low voltage output terminal as an ESD protection element, the positive and negative low voltage supply references having values being compatible with the CMOS technology.

According to this aspect of the disclosure, the output buffer may comprise a series of a first diode and a second diode inserted between the positive and negative low voltage supply references and interconnected at the low voltage output terminal.

A further embodiment of this disclosure is directed to a transmission channel for ultrasound applications comprising:

a transmission circuitry being inserted between an input terminal and a high voltage output terminal, whereto an input impulsive signal is transmitted, the transmission channel comprising a low voltage output terminal to a Low Noise Amplifier and a connection terminal to an ultrasound transducer; and at least one high voltage transmission switch connected between the connection terminal and the low voltage output terminal wherein the high voltage transmission switch comprises:
a switching block being coupled between a connection terminal to a load and a low voltage output terminal and comprising at least a first switching transistor and a second switching transistor being coupled between the connection terminal and the low voltage output terminal and interconnected at a first circuit node; and
a driving circuit being coupled between a positive low voltage supply reference and a negative high voltage supply reference and having an output terminal connected to the switching block,
the driving circuit in turn comprising at least a first driving transistor being coupled between the positive low voltage supply reference and the output terminal and a second driving transistor being coupled between the output terminal and the negative high voltage supply reference.

According to an aspect of the disclosure, the first and second switching transistors of the switching block of the high voltage transmission switch may have a common source terminal and respective control terminals coupled to a second circuit node, in turn coupled to the output terminal of the driving circuit and to the first circuit node by means of a Zener diode as a protection element.

According to another aspect of the disclosure, the first and second switching transistors of the switching block of the high voltage transmission switch may be High Voltage MOS transistors of the N type.

According to yet another aspect of the disclosure, the positive low voltage reference may have a value compatible with the CMOS technology.

Moreover, according to another aspect of the disclosure, the first driving transistor of the driving circuit of the high voltage transmission switch may have a control terminal directly connected to an input terminal of the driving circuit wherein a logic control signal is provided, the logic control signal being a CMOS control signal ranging between a ground value and the positive low voltage supply value; and the second driving transistor of the driving circuit of the high voltage transmission switch may have a control terminal connected the input terminal by means of a level shifter, which transforms the logic control signal into a control signal ranging between the positive low voltage supply value and the negative high voltage supply value.

According to yet another aspect of the disclosure, the high voltage transmission switch may further comprise an output buffer being coupled between the positive low voltage supply reference and a negative low voltage supply reference and connected to the low voltage output terminal as an ESD protection element, the positive and negative low voltage supply references having values being compatible with the CMOS technology.

According to this aspect of the disclosure, the output buffer of the high voltage transmission switch may comprise a series of a first diode and a second diode inserted between the positive and negative low voltage supply references and interconnected at the low voltage output terminal.

Still another embodiment of this disclosure is directed to a transmission channel for ultrasound applications comprising:
a transmission circuitry being inserted between an input terminal and a high voltage output terminal, whereto an input impulsive signal is transmitted, the transmission channel comprising a low voltage output terminal to a Low Noise Amplifier and a connection terminal to an ultrasound transducer; and
at least one high voltage transmission switch connected between the connection terminal and the low voltage output terminal wherein the high voltage transmission switch comprises:
a switching block being coupled between a connection terminal to a load and a low voltage output terminal and comprising at least a first switching transistor and a second switching transistor being coupled between the connection terminal and the low voltage output terminal and interconnected at a first circuit node; and
a driving circuit being coupled between a positive low voltage supply reference and a negative low voltage supply reference and having a first and a second output terminals connected to the switching block,
the driving circuit in turn comprising at least the series of a first driving transistor and a driving diode being coupled between the positive low voltage supply reference and the first output terminal and a second driving transistor being coupled between the first output terminal and the negative low voltage supply reference.

According to an aspect of the disclosure, the first switching transistor of the switching block of the high voltage transmission switch may have a control terminal coupled to a second circuit node, in turn coupled to the first output terminal of the driving circuit and to the first circuit node by means of a Zener diode as a protection element and the second switching transistor may have a control terminal coupled to a third circuit node, in turn coupled to the second output terminal of the driving circuit.

According to another aspect of the disclosure, the first switching transistor of the switching block of the high voltage transmission switch may be a High Voltage MOS transistor of the P type and the second switching transistor of the switching block of the high voltage transmission switch may be a High Voltage MOS transistor of the N type, the first switching transistor having a source terminal connected to a drain terminal of the second switching transistor.

According to yet another aspect of the disclosure, the positive and negative low voltage references may have values compatible with the CMOS technology.

Moreover, according to an aspect of the disclosure, the first driving transistor of the driving circuit of the high voltage transmission switch may have a control terminal directly connected to an input terminal of the driving circuit wherein a logic control signal is provided, the logic control signal being a CMOS control signal ranging between a ground value and the positive low voltage supply value; and the second driving transistor of the driving circuit of the high voltage transmission switch may have a control terminal connected the input terminal of the driving circuit by means of a level shifter, which transforms the logic control signal into a control signal ranging between the negative low voltage supply value and the ground value.

According to another aspect of the disclosure, the driving circuit of the high voltage transmission switch may further comprise an inverter coupled between its input terminal and its second output terminal.

According to yet another aspect of the disclosure, the high voltage transmission switch may further comprise an output buffer being coupled between the positive low voltage supply reference and a negative low voltage supply reference and connected to the low voltage output terminal as an ESD protection element, the positive and negative low voltage supply references having values being compatible with the CMOS technology.

According to this aspect of the disclosure, the output buffer of the high voltage transmission switch may comprise a series of a first diode and a second diode inserted between the positive and negative low voltage supply references and interconnected at the low voltage output terminal.

The characteristics and advantages of the high voltage transmission switch and of the transmission channel according to the disclosure will be apparent from the following description of embodiments thereof given by way of indicative and non limiting example with reference to the annexed drawings.

DETAILED DESCRIPTION

Figure 1:
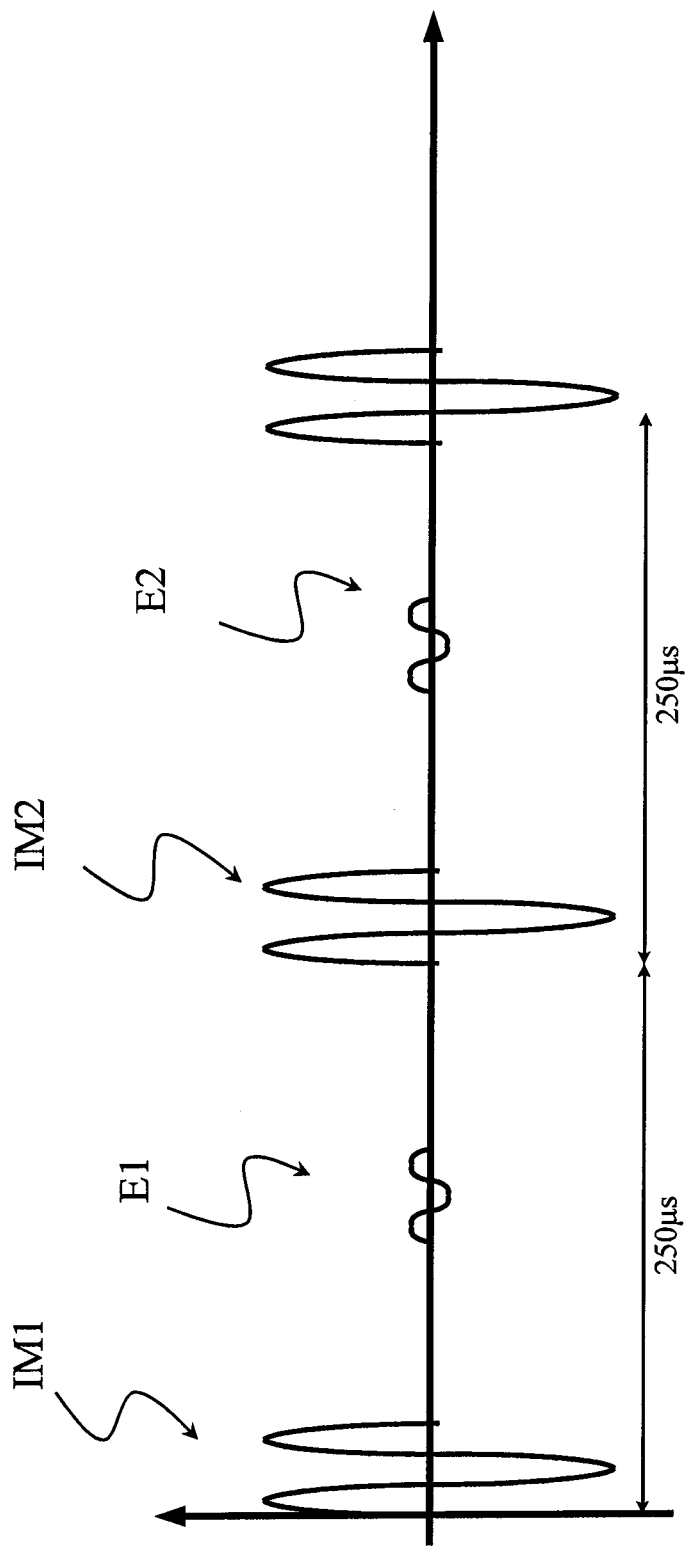
FIG. 1 schematically shows a first and a second ultrasound pulse being generated by a driving circuit and thereby applied to an ultrasonic transducer according to the prior art.
Figure 2:
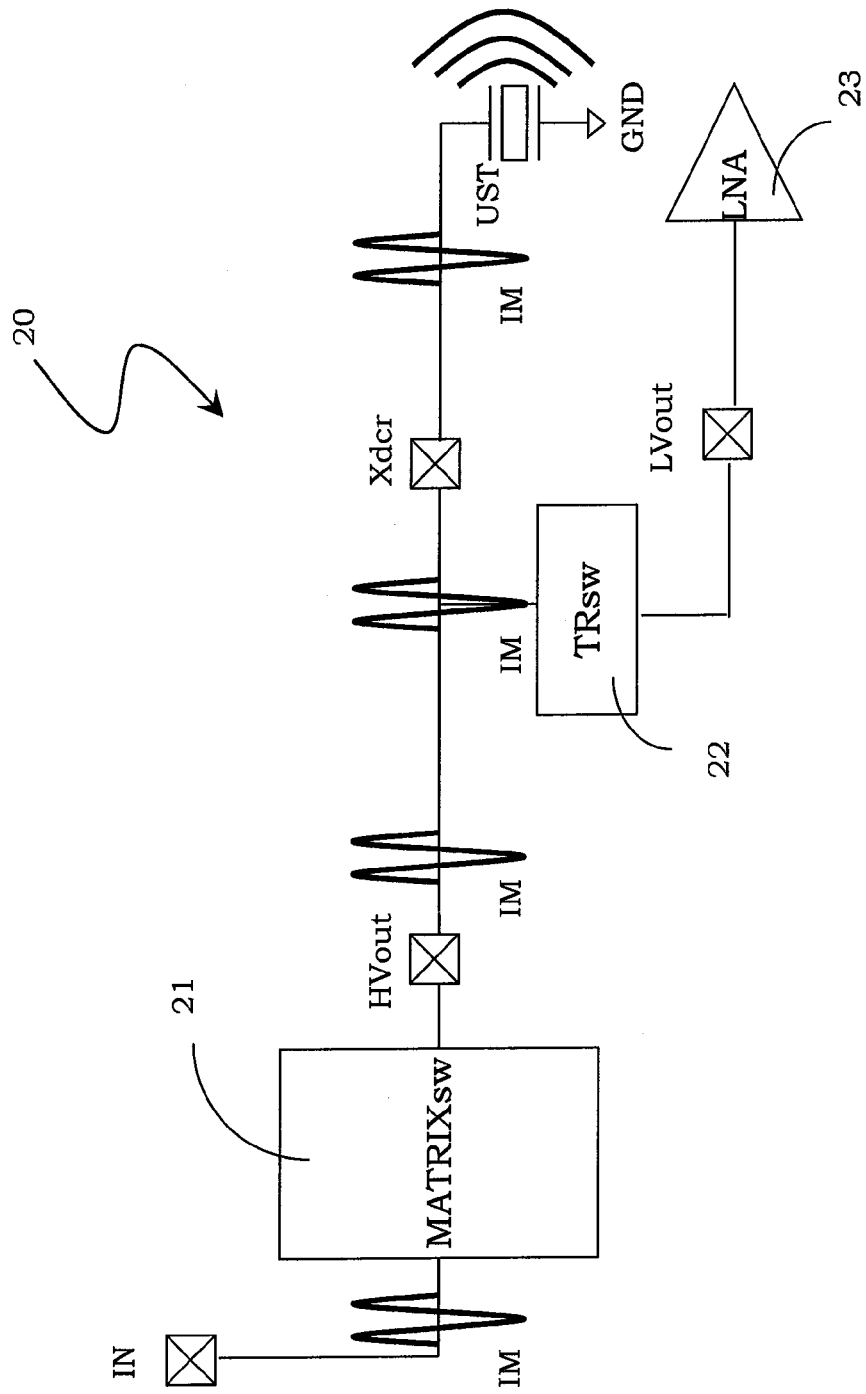
FIG. 2 schematically shows a transmission channel for ultrasound applications realized according to the prior art.
Figure 3:
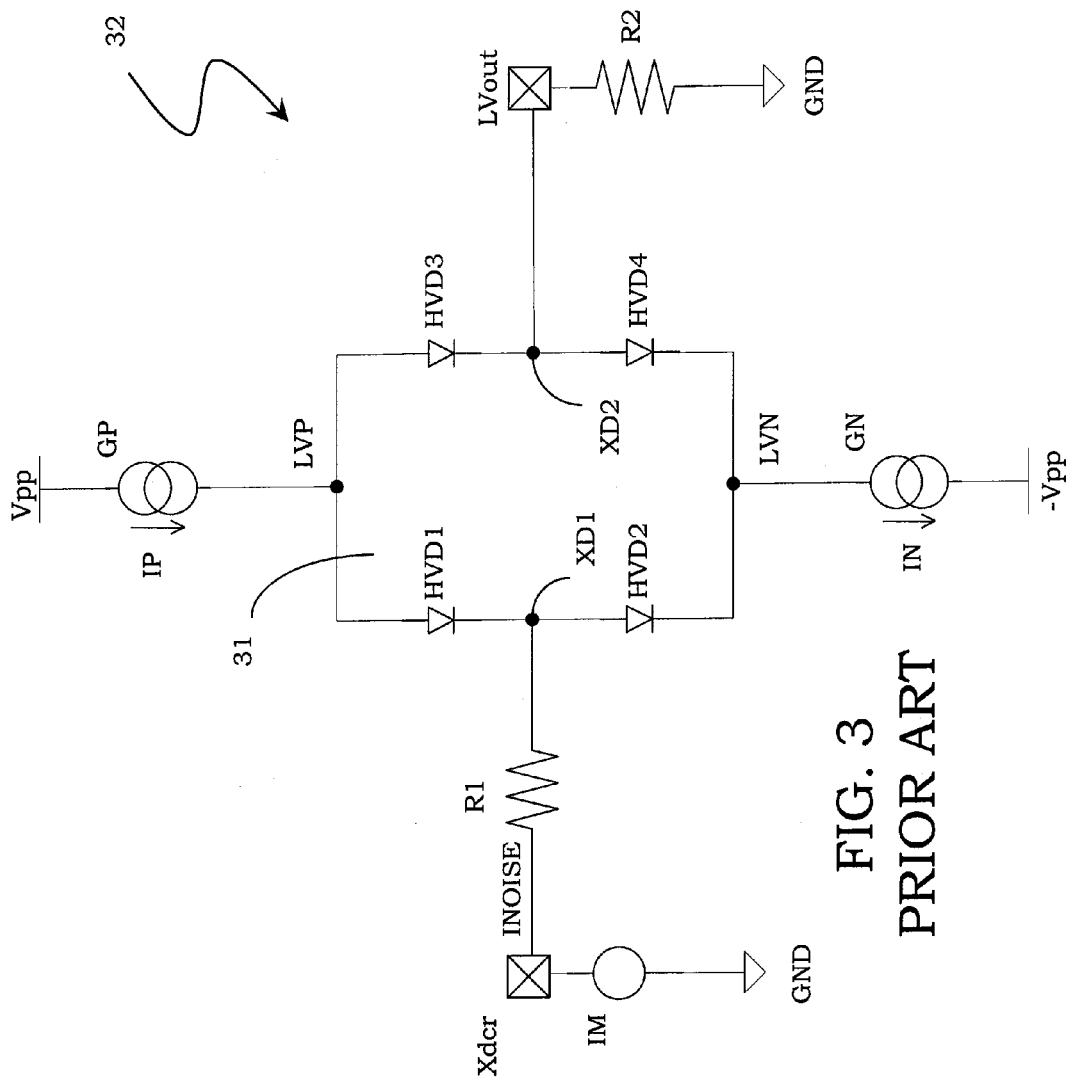
FIG. 3 schematically shows a high voltage transmission switch for ultrasound applications realized according to the prior art.
Figure 4:
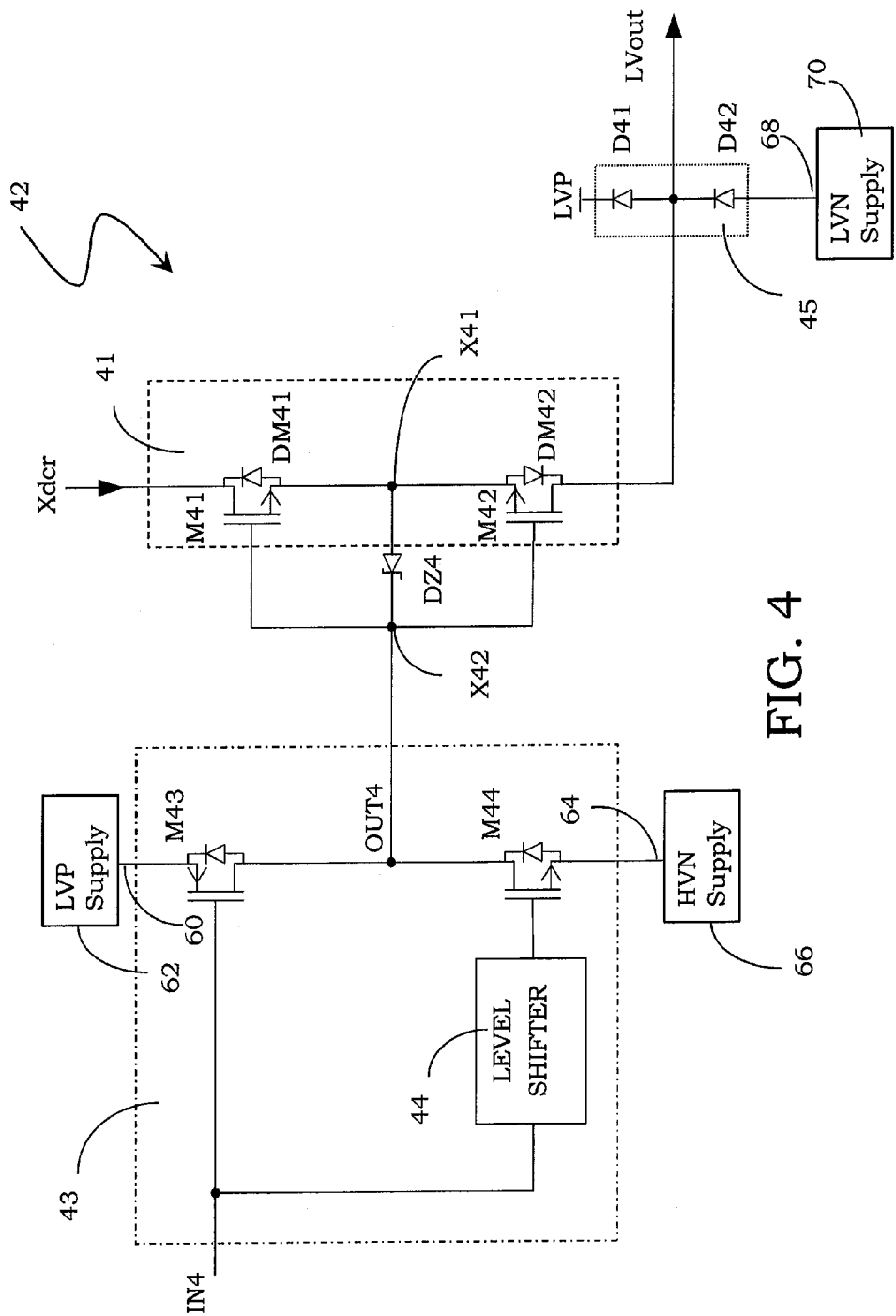
FIG. 4 schematically shows a high voltage transmission switch for ultrasound applications realized according to an embodiment of the present disclosure.

With reference to such figures, and in particular to FIG. 4, generally shown at 42 is a high voltage transmission switch for ultrasound applications according to an embodiment of the disclosure.

In the following description, numerous specific details are given to provide a thorough understanding of embodiments. The embodiments can be practiced without one or more of the specific details, or with other methods, components, materials, etc. In other instances, well-known structures, materials, or operations, are not shown or described in detail to avoid obscuring aspects of the embodiments.

Reference throughout this specification to "one embodiment" or "an embodiment" means that a particular feature, structure, or characteristic described in connection with the embodiment is included in at least one embodiment. Thus, the appearances of the phrases "in one embodiment" "according to an embodiment" or "in an embodiment" and similar phrases in various places throughout this specification are not necessarily all referring to the same embodiment. Furthermore, the particular features, structures, or characteristics may be combined in any suitable manner in one or more embodiments.

It should be noted that the figures showing schematic views of the high voltage transmission switch according to the embodiments of the disclosure are not drawn in scale, being on the contrary drafted so as to emphasize the important features thereof.

The high voltage transmission switch 42 comprises a switching block 41 coupled between a connection terminal Xdcr to a load, namely an ultrasound transducer and a low voltage output terminal LVout to a Low Noise Amplifier (LNA) of a transmission channel for ultrasounds applications.

In particular, the switching block 41 comprises a first switching transistor M41 and a second switching transistor M42 being coupled, with a common source terminal corresponding to a first circuit node X41, between the connection terminal Xdcr and the low voltage output terminal LVout. The first and second switching transistors, M41 and M42, have respective control or gate terminals coupled to a second circuit node X42, in turn coupled to the first circuit node X41 by means of a Zener diode DZ4 as a protection element.

More in particular, the first and second switching transistors, M41 and M42, are high voltage MOS transistors of the N type having a common source terminal, so as to ensure that one of their intrinsic body-drain diodes, DM41 and DM42, is always inversely biased when the switching block 41 is OFF. It is suitable to note that the ON state of the switching block 41 is obtained by applying to the gate terminals of these switching transistors, M41 and M42, a positive low voltage value, in particular equal to a positive voltage supply value compatible with the CMOS technology (namely, equal to 3.3V or 5V).

The high voltage transmission switch 42 further comprises a driving circuit 43 coupled between a first supply terminal 60, configured to receive a positive low voltage supply reference LVP from a positive low voltage supply 62, and a second supply terminal 64, configured to receive a negative high voltage supply reference HVN from a negative high voltage supply 66, and having an output terminal OUT4 connected to the second circuit node X42. More in particular, the driving circuit 43 comprises a first driving transistor M43 being coupled between the positive low voltage supply reference LVP and the output terminal OUT4 and a second driving transistor M44 being coupled between the output terminal OUT4 and the negative high voltage supply reference HVN.

The first driving transistor M43 has a control or gate terminal directly connected to an input terminal IN4 of the driving circuit 43 wherein a logic control signal TR is provided in order to force the ON or the OFF state to the switching block 41. In particular, the logic control signal TR is a CMOS control signal ranging between ground GND (0V) and the positive low voltage supply value LVP.

The second driving transistor M44 has a control or gate terminal connected the input terminal IN4 by means of a level shifter 44. It should be noted that, in order to switching off the switching block 41, a negative voltage value is applied to the gate terminals of the switching transistors, M41 and M42, and thus to the first circuit node X41. In particular, the negative voltage value is equal to the negative peak of the transmission signal, i.e. equal to the negative high voltage supply reference HVN and the level shifter 44 transforms the logic control signal TR into a control signal ranging between the positive low voltage supply value LVP and the negative high voltage supply value HVN.

The high voltage transmission switch 42 finally comprises an output buffer 45 coupled between the positive low voltage supply reference LVP and a third supply terminal 68 configured to receive a negative low voltage supply reference LVN from a negative low voltage supply 70 and connected to the low voltage output terminal LVout as an ESD (electrostatic discharge) protection element. In particular, the output buffer 45 comprises a series of a first diode D41 and a second diode D42 inserted between the positive and negative low voltage supply references, LVP and LVN, and interconnected at the low voltage output terminal LVout. The positive and negative low voltage supply references, LVP and LVN, have values being compatible with CMOS technology (namely, equal to ±3.3V or ±5V).

The turning on of the high voltage transmission switch 42 is done by connecting the gate terminals of the switching transistors M41 and M42, i.e. the second circuit node X42, to the positive low voltage supply reference LVP. The turning off is ensured by connecting the second circuit node X42 to the most negative supply voltage value, i.e. to the negative high voltage supply reference HVN.

It should be remarked that this embodiment of the high voltage transmission switch 42 has a limited consumption in terms of area occupation, no high voltage PMOS transistors being used in the signal transmission path and thus it can be conveniently used in case of applications benefiting from low values for the on resistance (Ron<20-30Ω).

Figure 5:
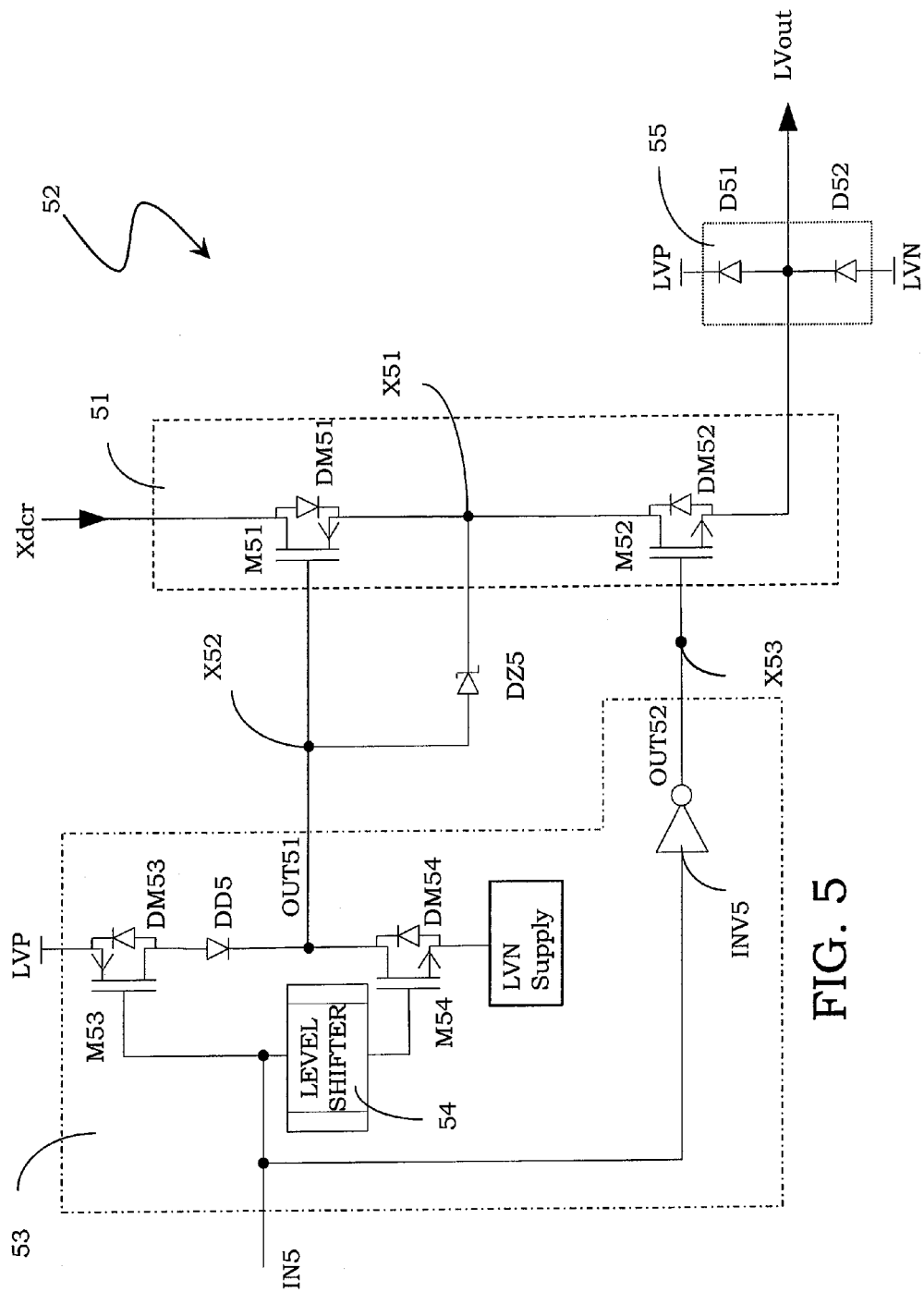
FIG. 5 schematically shows a high voltage transmission switch for ultrasound applications realized according to according to another embodiment of the present disclosure.

A further embodiment of the high voltage transmission switch according to an aspect of the disclosure is schematically shown in FIG. 5, globally indicated with 52.

The high voltage transmission switch 52 comprises a switching block 51 being coupled between a connection terminal Xdcr to a load, namely an ultrasound transducer and a low voltage output terminal LVout to a Low Noise Amplifier (LNA) of a transmission channel for ultrasounds applications.

In particular, the switching block 51 comprises a first switching transistor M51 and a second switching transistor M52 being coupled, in series to each other, between the connection terminal Xdcr and the low voltage output terminal LVout and interconnected at a first circuit node X51. The first switching transistor M51 has a control or gate terminal coupled to a second circuit node X52, in turn coupled to the first circuit node X51 by means of a Zener diode DZ5 as a protection element. The second switching transistor M52 has a control or gate terminal coupled to a third circuit node X53.

More in particular, the first switching transistor M51 is a High Voltage MOS transistor of the P type and the second switching transistor M52 is a High Voltage MOS transistor of the N type, the first switching transistor M51 having a source terminal connected to a drain terminal of the second switching transistor M52, so as to ensure that one of their intrinsic body-drain diodes, DM51 and DM52, is always inversely biased when the switching block 51 is OFF, and independently from the behavior of the connection terminal Xdcr. It is suitable to note that the ON/OFF state of the switching block 51 is obtained by means of a driving circuit 53 connected to the gate terminals of these switching transistors.

In particular, the driving circuit 53 is coupled between a positive low voltage supply reference LVP and a negative low voltage supply reference LVN and has a first output terminal OUT51 connected to the second circuit node X52 and a second output terminal OUT52 connected to the third circuit node X53. The positive and negative low voltage supply references, LVP and LVN, have values being compatible with the CMOS technology (namely, equal to ±3.3V or ±5V).

More in particular, the driving circuit 53 comprises the series of a first driving transistor M53 and of a driving diode DD5 being coupled between the positive low voltage supply reference LVP and the first output terminal OUT51 and a second driving transistor M54 being coupled between the first output terminal OUT51 and the negative low voltage supply reference LVN.

The first driving transistor M53 has a control or gate terminal directly connected to an input terminal IN5 of the driving circuit 53 wherein a logic control signal TR is provided in order to force the ON or the OFF state to the switching block 51. In particular, the logic control signal TR is a CMOS control signal ranging between ground GND (0V) and the positive low voltage supply value LVP.

The second driving transistor M54 has a control or gate terminal connected the input terminal IN5 by means of a level shifter 54, able to shift the dynamic of the logic control signal TR from a ground to the positive low voltage supply value LVP and the negative low voltage supply reference LVN to ground, as explained herein below. An inverter INV5 (namely a CMOS inverter) is coupled between the input terminal IN5 and the second output terminal OUT52.

The high voltage transmission switch 52 finally comprises an output buffer 55 being coupled between the positive low voltage supply reference LVP and the negative low voltage supply reference LVN and connected to the low voltage output terminal LVout as an ESD protection element. In particular, the output buffer 55 comprises a series of a first diode D51 and a second diode D52 inserted between the positive and negative low voltage supply references, LVP and LVN, and interconnected at the low voltage output terminal LVout.

It should be noted that, during a transmission phase of the transmission channel for ultrasounds applications, the connection terminal Xdcr is physically connected to the transducer and thus its voltage value ranges between −100V and +100V. During this transmission phase, the switching block 51 is OFF and the series of the switching transistors, M51 and M52, being a PMOS transistor and an NMOS transistor respectively, ensures its isolation from the connection terminal Xdcr. In fact, during the positive half wave of the voltage signal at the connection terminal Xdcr, the first switching transistor M51 (the PMOS transistor), while in its OFF state, is actually bypassed by its body-drain diode DM51 and its source terminal follows the signal at the input terminal IN5.

Still during this positive half wave of the voltage signal at the connection terminal Xdcr, the second switching transistor M52, which is also in its OFF state, has a body-drain diode DM52 being inversely biased, instead. In this way, the transmission signal at the connection terminal Xdcr is stopped and does not reach the Low Noise Amplifier (LNA) being connected to the low voltage output terminal LVout.

During the ON phase of the switching block 51, the second switching transistor M52 (the NMOS transistor) is turned on by applying a positive voltage value (namely equal to the positive low voltage supply value LVP) on its gate terminal, i.e. on the third circuit node X53. In particular, such a positive voltage value is provided by the inverter INV5.

It should be also noted that, being the signal to be received at the connection terminal Xdcr biased to a voltage value near ground GND, the first switching transistor M51 is turned on by applying to its gate terminal a negative voltage value, in particular equal to the negative low voltage supply value LVN. According to the embodiment shown in FIG. 5, this is done by means of the second driving transistor M54, which is a high voltage MOS transistor of the N type and has its gate terminal connected to the level shifter 54, which shifts the dynamic of the logic control signal TR from the range GND (0V) to LVP to the range LVN to GND (0V).

Moreover, it is underlined that the Zener diode DZ6, connected between the gate and source terminals of the first switching transistor M51 protects its gate oxide layer during the positive half wave of the voltage signal at the connection terminal Xdcr, i.e. when its source terminal, which is connected to the connection terminal Xdcr, raises toward 100V. In particular, the Zener diode DZ5 prevents the gate-source voltage value |Vgs| to overcome the positive low voltage supply value LVP (namely 3.3V or 5V).

In this aim, the gate terminal of the first switching transistor M51 is also connected to the positive low voltage supply reference LVP through a series of the first driving transistor M53 (which is an NMOS high voltage transistor) and the driving diode DD5, which is a high voltage diode as well.

A main advantage of the high voltage transmission switch according to this embodiment is that of having, when in its ON state, a low impedance value only when the signal which is applied to the input terminal IN5 ranges between (LVN+ Vth_p) and (LVP−Vth_n), being Vth_p and Vth_n the threshold voltage values of a PMOS transistor and an NMOS transistor, respectively.

In this way, the high voltage transmission switch according to this embodiment of the disclosure is a safety element which protects the Low Noise Amplifier (LNA) connected to the low voltage output terminal LVout in case of a wrong turning off of the switching block during a transmission phase.

Advantageously according to the embodiments of the disclosure, the high voltage transmission switch ensures that, when the switching block is in its OFF state, little or no charge is injected to the low voltage output terminal LVout, thus guaranteeing the correct protection of the Low Noise Amplifier (LNA) connected to the low voltage output terminal LVout.

From the foregoing it will be appreciated that, although specific embodiments of the disclosure have been described herein for purposes of illustration, various modifications may be made without deviating from the spirit and scope of the disclosure.

The various embodiments described above can be combined to provide further embodiments. These and other changes can be made to the embodiments in light of the above-detailed description. In general, in the following claims, the terms used should not be construed to limit the claims to the specific embodiments disclosed in the specification and the claims, but should be construed to include all possible embodiments along with the full scope of equivalents to which such claims are entitled. Accordingly, the claims are not limited by the disclosure.

The invention claimed is:

1. A high voltage transmission switch comprising:
 a high voltage output terminal configured to be coupled to a load;
 a low voltage output terminal;
 a first supply terminal configured to be supplied with a positive voltage supply reference;
 a second supply terminal configured to be supplied with a negative voltage supply reference;
 a switching block electrically coupled between the high voltage output terminal and the low voltage output terminal and including a first switching transistor and a second switching transistor electrically coupled between the high voltage output terminal and the low voltage output terminal and interconnected at a first circuit node, the first switching transistor being electrically coupled between the high voltage output terminal and the first circuit node, the second switching transistor being electrically coupled between the first circuit node and the low voltage output terminal; and
 a driving circuit electrically coupled between the first and second supply terminals, the driving circuit including:
  a first output terminal electrically coupled to the switching block;
  a first driving transistor electrically coupled between the first supply terminal and the first output terminal of the driving circuit; and
  a second driving transistor electrically coupled between the first output terminal of the driving circuit and the second supply terminal.

2. The high voltage transmission switch of claim 1, wherein the first and second switching transistors have a common source terminal and respective control terminals, the high voltage transmission switch further comprising a Zener diode coupled between the output terminal of the driving circuit and the first circuit node.

3. The high voltage transmission switch of claim 1, wherein the first and second switching transistors are high voltage NMOS transistors.

4. The high voltage transmission switch of claim 1, wherein the positive voltage supply reference is a positive low voltage supply reference having a value compatible with CMOS technology and the driving circuit is configured to provide a high voltage driving signal based on the positive low voltage supply reference.

5. The high voltage transmission switch of claim 1, wherein the positive voltage supply reference is a positive low voltage supply reference having a value compatible with CMOS technology, the negative voltage supply reference is a negative high voltage supply reference, and the driving circuit includes:
 an input terminal coupled to a control terminal of the first driving transistor and configured to receive a CMOS control signal ranging between a ground value and the positive low voltage supply reference; and
 a level shifter coupled between the input terminal and a control terminal of the second driving transistor, the level shifter being configured to transform the CMOS control signal into a control signal ranging between the positive low voltage supply reference and the negative high voltage supply reference.

6. The high voltage transmission switch of claim 1, wherein the positive voltage supply reference is a positive low voltage supply reference having a value compatible with CMOS technology and the negative voltage supply reference is a negative high voltage supply reference, the high voltage transmission switch further comprising:
 a third supply terminal configured to be supplied with a negative low voltage supply reference; and
 an output buffer coupled between the first supply terminal and the third supply terminal, the output buffer being coupled to the low voltage output terminal and configured to operate as an ESD protection element.

7. The high voltage transmission switch of claim 6, wherein the output buffer comprises:
 a first diode coupled between the first supply terminal and the low voltage output terminal; and
 a second diode coupled between the third supply terminal and the low voltage output terminal.

8. The high voltage transmission switch of claim 1, wherein the positive voltage supply reference is a positive low voltage supply reference having a value compatible with CMOS technology and the negative voltage supply reference is a negative high voltage supply reference, the high voltage transmission switch further comprising:
 a first voltage supply coupled to the first supply terminal and configured to supply the positive low voltage supply reference; and
 a second voltage supply coupled to the first supply terminal and configured to the negative high voltage supply reference.

9. The high voltage transmission switch of claim 1, wherein:
 the first supply terminal is configured to be supplied with a positive low voltage supply reference;
 the second supply terminal is configured to be supplied with a negative low voltage supply reference; and
 the driving circuit includes:
  a second output terminal coupled to the switching block;
  a driving diode coupled with the first driving transistor between the first supply terminal and the first output terminal of the driving circuit.

10. The high voltage transmission switch of claim 9, wherein the first switching transistor has a control terminal coupled to the first output terminal of the driving circuit, the high voltage transmission switch further comprising a Zener diode coupled between the control terminal and the first circuit node, the Zener diode being configured to operate as a protection element and wherein the second switching transistor has a control terminal coupled to the second output terminal of the driving circuit.

11. The high voltage transmission switch of claim 9, wherein the first switching transistor is a high voltage PMOS transistor and the second switching transistor is a high voltage NMOS transistor, the first switching transistor having a source terminal connected to a drain terminal of the second switching transistor.

12. The high voltage transmission switch of claim 9, wherein the driving circuit is configured to provide a high voltage driving signal based on the positive low voltage reference having a value compatible with CMOS technology.

13. The high voltage transmission switch of claim 9, wherein the driver circuit includes:
 an input terminal coupled to a control terminal of the first driving transistor and configured to receive a CMOS control signal ranging between a ground value and the positive low voltage supply reference; and
 a level shifter coupled between the input terminal and a control terminal of the second driving transistor, the level shifter being configured to transform the CMOS control signal into a control signal ranging between the negative low voltage supply reference and the ground value.

14. The high voltage transmission switch of claim 13, wherein the driving circuit further comprises an inverter coupled between the input terminal and the second output terminal.

15. The high voltage transmission switch of claim 9, further comprising:
 an output buffer coupled between the first supply terminal and the second supply terminal, the output buffer being coupled to the low voltage output terminal and configured to operate as an ESD protection element.

16. The high voltage transmission switch of claim 15, wherein the output buffer comprises:
 a first diode coupled between the first supply terminal and the low voltage output terminal; and
 a second diode coupled between the second supply terminal and the low voltage output terminal.

17. The high voltage transmission switch of claim 9, further comprising:
 a first voltage supply coupled to the first supply terminal and configured to supply the positive low voltage supply reference; and
 a second voltage supply coupled to the first supply terminal and configured to the negative low voltage supply reference.

18. A transmission channel comprising:
 an input terminal configured to receive a pulse signal;
 a high voltage output terminal configured to be coupled to an ultrasound transducer;
 a low voltage output terminal configured to be coupled to a low noise amplifier;
 a first supply terminal configured to be supplied with a positive voltage supply reference;
 a second supply terminal configured to be supplied with a negative voltage supply reference;
 a transmission circuit positioned between the input terminal and the high voltage output terminal; and
 a high voltage transmission switch coupled between the high voltage output terminal and the low voltage output terminal, the high voltage transmission switch including:
  a switching block coupled between the high voltage output terminal and the low voltage output terminal and including a first switching transistor and a second switching transistor coupled between the high voltage output terminal and the low voltage output terminal and interconnected at a first circuit node; and
  a driving circuit coupled between the first and second supply terminals, the driving circuit including:
   a first output terminal coupled to the switching block,
   a first driving transistor coupled between the first supply terminal and the output terminal of the driving circuit; and
   a second driving transistor coupled between the output terminal of the driving circuit and the second supply terminal.

19. The transmission channel of claim 18, wherein the first and second switching transistors have a common source terminal and respective control terminals coupled to the output terminal of the driving circuit, the high voltage transmission switch including a Zener diode coupled between the output terminal of the driving circuit and the first circuit node, the Zener diode being configured to operate as a protection element.

20. The transmission channel of claim 18, wherein the first and second switching transistors are high voltage NMOS transistors.

21. The transmission channel of claim 18, wherein the positive voltage supply reference is a positive low voltage supply reference having a value compatible with CMOS technology, the negative voltage supply reference is a negative high voltage supply reference, and the driving circuit includes:
 an input terminal coupled to a control terminal of the first driving transistor and configured to receive a CMOS control signal ranging between a ground value and the positive low voltage supply reference; and
 a level shifter coupled between the input terminal and a control terminal of the second driving transistor, the level shifter being configured to transform the CMOS control signal into a control signal ranging between the positive low voltage supply reference and the negative high voltage supply reference.

22. The transmission channel of claim 18, wherein the positive voltage supply reference is a positive low voltage supply reference having a value compatible with CMOS technology, the negative voltage supply reference is a negative high voltage supply reference, and the high voltage transmission switch further comprises:
 a third supply terminal configured to be supplied with a negative low voltage supply reference; and
 an output buffer coupled between the first supply terminal and the third supply terminal, the output buffer being coupled to the low voltage output terminal and configured to operate as an ESD protection element.

23. The transmission channel of claim 22, wherein the output buffer comprises
 a first diode coupled between the first supply terminal and the low voltage output terminal; and
 a second diode coupled between the third supply terminal and the low voltage output terminal.

24. The transmission channel of claim 18, wherein:
 the first supply terminal is configured to be supplied with a positive low voltage supply reference;
 the second supply terminal is configured to be supplied with a negative low voltage supply reference; and
 the driving circuit includes:
  a second output terminal coupled to the switching block, a driving diode coupled with the first driving transistor between the first supply terminal and the first output terminal.

25. The transmission channel of claim 24, wherein the first switching transistor has a control terminal coupled to the first output terminal of the driving circuit, the high voltage transmission switch including a Zener diode coupled between the control terminal and the first circuit node, the Zener diode being configured to operate as a protection element and wherein the second switching transistor has a control terminal coupled to the second output terminal of the driving circuit.

26. The transmission channel of claim 24, wherein the first switching transistor is a high voltage PMOS transistor and the second switching transistor is a high voltage NMOS transistor, the first switching transistor having a source terminal connected to a drain terminal of the second switching transistor.

27. The transmission channel of claim 24, wherein the driver circuit includes:
an input terminal coupled to a control terminal of the first driving transistor and configured to receive a CMOS control signal ranging between a ground value and the positive low voltage supply reference; and
a level shifter coupled between the input terminal and a control terminal of the second driving transistor, the level shifter being configured to transform the CMOS control signal into a control signal ranging between the negative low voltage supply reference and the ground value.

28. The transmission channel of claim 24, wherein the driving circuit of the high voltage transmission switch further comprises an inverter coupled between the input terminal of the driving circuit and the second output terminal.

29. The transmission channel of claim 24, wherein the high voltage transmission switch further comprises an output buffer coupled between the first supply terminal and the second supply terminal, the output buffer being coupled to the low voltage output terminal and configured to operate as an ESD protection element.

30. The transmission channel of claim 29, wherein the output buffer comprises:
a first diode coupled between the first supply terminal and the low voltage output terminal; and
a second diode coupled between the second supply terminal and the low voltage output terminal.

* * * * *